(12) United States Patent
Shah

(10) Patent No.: US 7,170,179 B1
(45) Date of Patent: Jan. 30, 2007

(54) CHIP SELECT METHOD THROUGH DOUBLE BONDING

(75) Inventor: Shailesh Shah, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 558 days.

(21) Appl. No.: 10/134,764

(22) Filed: Apr. 29, 2002

(51) Int. Cl.
*H01L 23/48* (2006.01)
*H01L 25/00* (2006.01)

(52) U.S. Cl. .................... 257/773; 257/786; 326/41

(58) Field of Classification Search ............... 365/201, 365/233, 189.02, 189.056
See application file for complete search history.

(56) References Cited

U.S. PATENT DOCUMENTS

| | | | | |
|---|---|---|---|---|
| 5,181,201 A | | 1/1993 | Schauss et al. ............ 370/85.1 |
| 5,796,266 A | * | 8/1998 | Wright et al. ............... 324/763 |
| 5,872,737 A | * | 2/1999 | Tsuruda et al. ......... 365/189.05 |
| 5,991,232 A | * | 11/1999 | Matsumura et al. ........ 365/233 |
| 6,038,188 A | * | 3/2000 | Akamatsu .................... 365/226 |
| 6,180,426 B1 | * | 1/2001 | Lin ............................. 438/15 |
| 6,242,737 B1 | * | 6/2001 | Ohnishi et al. ............. 250/306 |
| 6,353,333 B1 | * | 3/2002 | Curd et al. .................... 326/81 |
| 6,586,266 B1 | * | 7/2003 | Lin ............................. 438/15 |
| 6,597,602 B2 | * | 7/2003 | Imamiya et al. ....... 365/185.04 |

* cited by examiner

*Primary Examiner*—Alonzo Chambliss
(74) *Attorney, Agent, or Firm*—Christopher P. Maiorana, PC

(57) ABSTRACT

A chip generally comprising a logic circuit and a plurality of pads. The logic circuit may be configured to operate in a plurality of modes in response to a mode signal. The pads may be configurable into a plurality of subsets such that one of the subsets is used by the logic circuit at a time in response to the mode signal.

19 Claims, 8 Drawing Sheets

CHIP SELECT METHOD THROUGH DOUBLE BONDING

FIELD OF THE INVENTION

The present invention relates to a method and/or architecture for configurable chips generally and, more particularly, to a method and/or architecture for configurable chips having different pad configurations in different modes.

BACKGROUND OF THE INVENTION

Manufacturers of semiconductor devices commonly produce a family of devices based on a core set of functionality. The different members of the family vary by packaging, pin assignments and numbers of special purpose input and/or output pins that tailor the devices to specific applications. Production of the various family members commonly involves production of a unique chip for each distinct device. The unique chips often vary from each other by one or more masks used in the fabrication processes.

Since each chip family has a unique fabrication, the devices incorporating the chips remain unique throughout the life cycles of the devices. Therefore, each device type in the family commonly has a unique production schedule, unique qualification and test procedures and a separate inventory. Treating each device of the family differently increases the costs of the devices.

SUMMARY OF THE INVENTION

The present invention concerns a chip generally comprising a logic circuit and a plurality of pads. The logic circuit may be configured to operate in a plurality of modes in response to a mode signal. The pads may be configurable into a plurality of subsets such that one of the subsets is used by the logic circuit at a time in response to the mode signal.

The objects, features and advantages of the present invention include providing a method and/or architecture for a configurable chip that may (i) be configured as one of several different devices, (ii) minimize overall costs, (iii) simplify qualification, (iv) simplify testing and/or (v) allow a single mask set to be used for multiple products.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
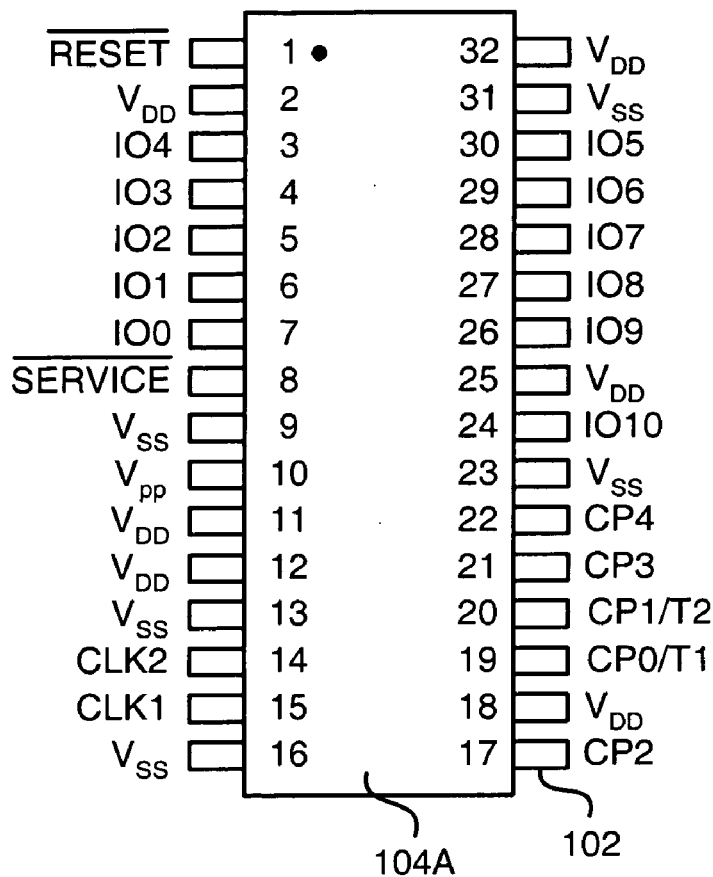
FIG. 1 is a package drawing of a first device.
Figure 2:
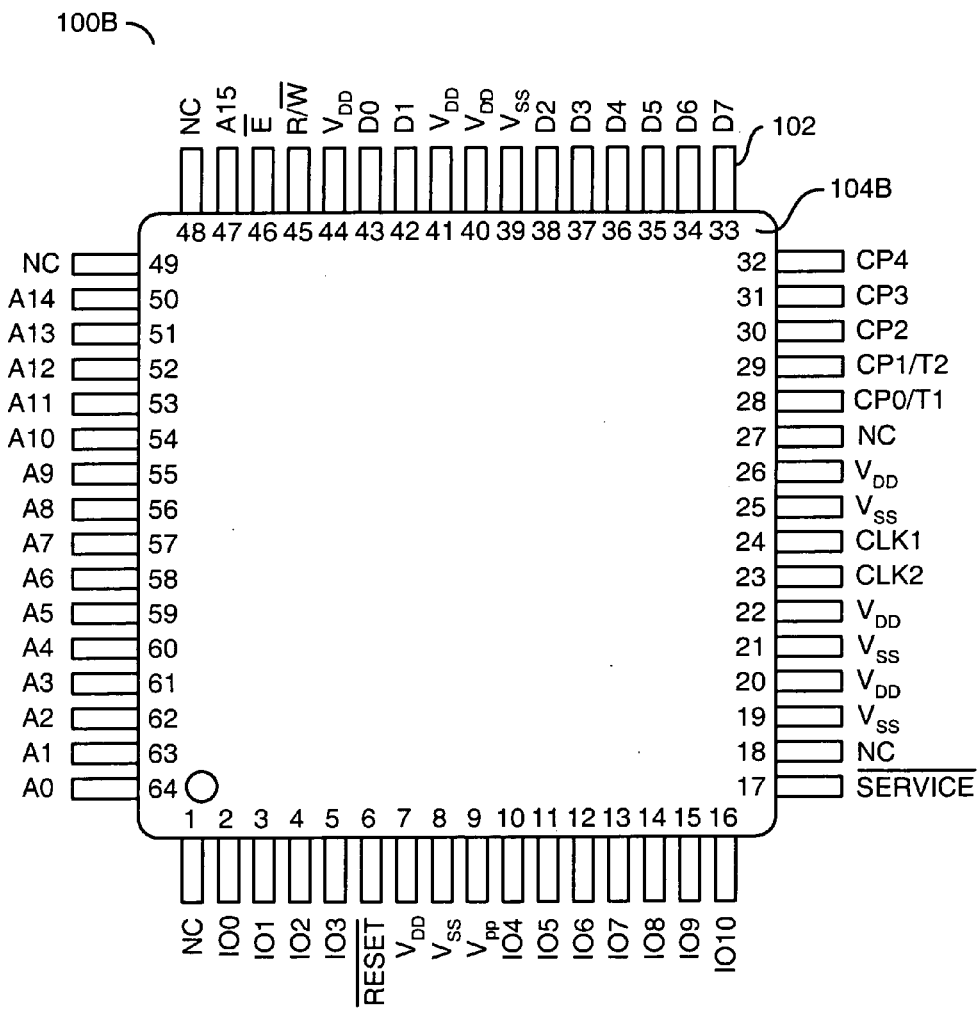
FIG. 2 is a package drawing of a second device.

Referring to FIGS. 1 and 2, package drawings of a device 100A and a related device 100B are shown in accordance with a preferred embodiment of the present invention. Each of the devices 100A and 100B generally includes multiple pins, balls, tabs, solder bumps or similar elements for externally interfacing to the devices 100A and 100B. Hereafter, the various pins, balls, tabs, solder bumps and the like may be referred to generally as a pin 102, pins 102 and/or a specific pin X (where X is a pin number 1<X<64). Each device 100A and 100B may also include a package 104. The device 100A may be implemented as a 32-pin small outline integrated circuit (SOIC) package 104A. The device 100B may be implemented as a 64-pin thin quad flat package (TQFP) 104B. Hereafter, the various package types 104A and 104B may be referred to generally as a package 104 and/or packages 104. Other packages 104 and/or pin configurations may be implemented to meet the design criteria of a particular application using the invention.

Both devices 100A and 100B may be implemented as processors. Functional differences between the device 100A and the device 100B may include, but are not limited to, a capability to interface to an external memory circuit (not shown) and/or a twisted pair transceiver capability. Other functions may be implemented within the device 100A and/or the device 100B to meet the design criteria of a particular application.

The device 100A may be implemented as two different devices or parts (e.g., P1 and P2). The device 100B may be implemented as two different devices or parts (e.g., P3 and P4). The part P1 may differ from the part P2, and the part P3 may differ from the part P4, based upon variations in signal assignments to one or more pins 102. For example, the part P1 may assign a signal (e.g., CP0) to a pin 19, whereas the part P2 may assign another signal (e.g., T1) to the same pin 19. Likewise, the part P1 may assign a signal (e.g., CP1) to a pin 20 and the part P2 may assign another signal (e.g., T2) to the pin 20. The part P3 may assign the signal CP0 to a pin 28 and the part P4 may assign the signal T1 to the pin 28. The part P3 may assign the signal CP1 to a pin 29 and the part P4 may assign the signal T2 to the pin 29.

Figure 3:
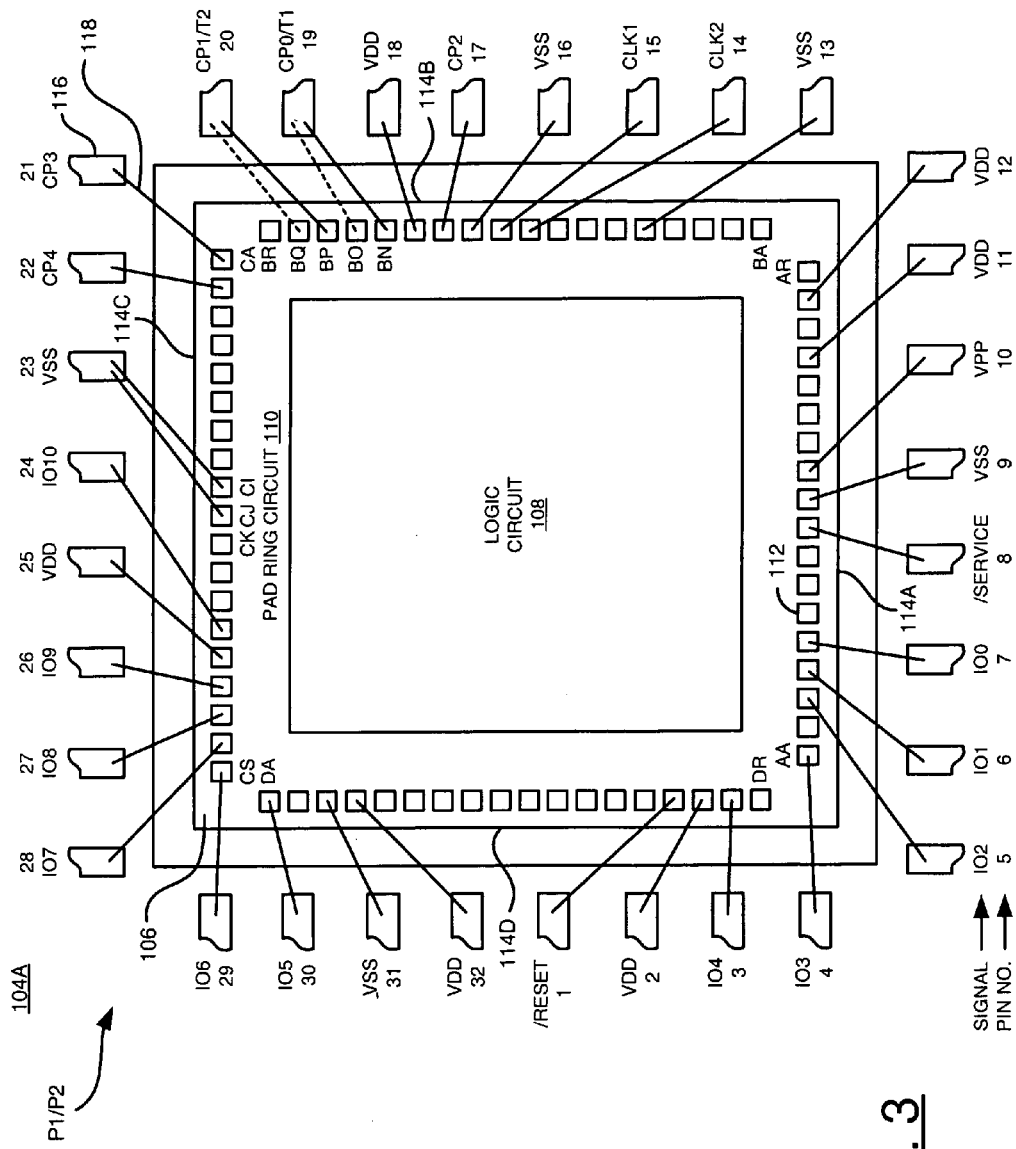
FIG. 3 is a wire bonding diagram of a first and a second part and a block diagram of a chip.

Referring to FIG. 3, a wire bonding diagram/block diagram of the parts P1 and P2 are shown. The part P1 generally comprises the package 104A and a chip 106. Other elements (not shown) such as capacitors, resistors, inductors, and such may be included within the package 104A along with the chip 106.

The chip 106 generally comprises a logic circuit 108 and a pad ring circuit 110. The logic circuit 108 may provide the functionality of the devices 100A–B and the parts P1–P4. The pad ring circuit 110 may provide for unidirectional inputs, unidirectional outputs, bidirectional input/outputs (IO), power, power returns or ground, clocks, reference signals and the like between the logic circuit 108 and the pins 102.

The pad ring circuit 110 generally comprises multiple pads 112 distributed along edges 114A–D of the chip 106. As shown in FIG. 3, the edges 114A–D may be referred to as a first edge 114A, a second edge 114B, a third edge 114C and a fourth edge 114D. Other number of edges and/or other edge references may be provided to meet the design criteria of a particular application.

Figure 4:
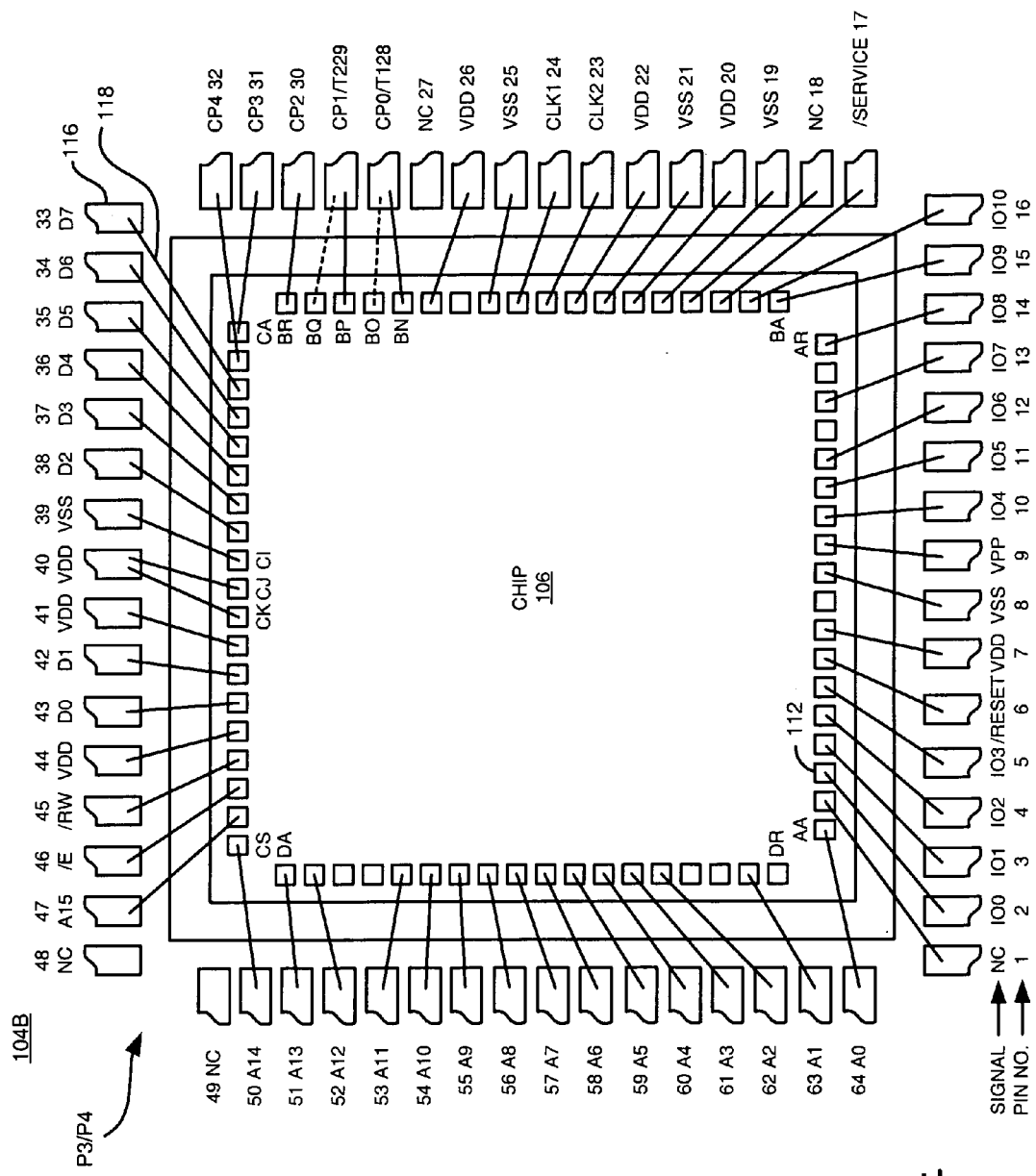
FIG. 4 is a wire bonding diagram of a third and a fourth part using the chip.

Each pad 112 along the first edge 114A (e.g., a bottom edge as shown in FIGS. 3 and 4) may be uniquely identified by reference letters AA through AR. The pads 112 along the second edge 114B (e.g., a right edge in FIGS. 3 and 4) may be uniquely identified by reference letters BA through BR. The pads 112 along the third edge 114C (e.g., a top edge in FIGS. 3 and 4) may be uniquely identified right to left by reference letters CA through CS. The pads 112 along the fourth edge 114D (e.g., a left edge in FIGS. 3 and 4) may be uniquely identified by reference letters DA through DR. Other arrangements of the pads 112 along the edges 114A–D may be implemented to meet the design criteria of a particular application. For example, a similar number of pads 112 may be positioned along each of the edges 114A–D with the chip 106 having a generally square shape. In another example where the chip 106 has a generally rectangular shape, a greater number of pads 112 may be positioned along the longer edges 114 than along the shorter edges 114.

Wire bonds, tabs, solder bumps or similar elements may be used to connect the pads 112 to package traces 116 of the package 104A. Each package trace 116 may be uniquely connected to a pin 102. Hereafter, the wire bonds, tabs, solder bumps and such may be referred to generally as wire bonds 118. Furthermore, references to connections between the pads 112 and the pins 102 may be inferred to include the wire bond 118 and the package trace 116 connections.

Some of the pads 112 may be coupled to the same pins 102 for all four different parts P1–P4. Other pads 112 may be coupled to different pins 102 depending on the part P1–P4 being implemented. Still other pads 112 may not be coupled to any pins 102 of any of the four parts P1–P4. Conversely, some of the pins 102 may not be coupled to any of the pads 112. Various pads 112 may be coupled to the same pin 102 to help the logic circuit 108 and the pad ring circuit 110 identify the particular mode (e.g., M1 or M2), device 100A–100B and/or part P1–P4 being implemented. Example assignments of the pads 112 to the pins 102 for each of the modes M1–M2 are shown in Tables I–IV as follows:

TABLE I

First Edge 114A

| Pad No. | Mode M1 Signal | Part P1 Pin No. | Part P2 Pin No. | Mode M2 Signal | Part P3 Pin No. | Part P4 Pin No. |
|---|---|---|---|---|---|---|
| AA | IO3 | 4 | 4 | A0 | 64 | 64 |
| AB | Not used | | | NC | 1 | 1 |
| AC | IO2 | 5 | 5 | IO0 | 2 | 2 |
| AD | IO1 | 6 | 6 | IO1 | 3 | 3 |
| AE | IO0 | 7 | 7 | IO2 | 4 | 4 |
| AF | Not used | | | IO3 | 5 | 5 |
| AG | Not used | | | /RESET | 6 | 6 |
| AH | Not used | | | VDD | 7 | 7 |
| AI | /SERVICE | 8 | 8 | Not used | | |
| AJ | VSS | 9 | 9 | VSS | 8 | 8 |
| AK | VPP | 10 | 10 | VPP | 9 | 9 |
| AL | Not used | | | IO4 | 10 | 10 |
| AM | Not used | | | IO5 | 11 | 11 |
| AN | Not used | | | IO6 | 12 | 12 |
| AO | VDD | 11 | 11 | Not used | | |
| AP | Not used | | | IO7 | 13 | 13 |
| AQ | VDD | 12 | 12 | Not used | | |
| AR | Not used | | | IO8 | 14 | 14 |

TABLE II

Second Edge 114B

| Pad No. | Mode M1 Signal | Part P1 Pin No. | Part P2 Pin No. | Mode M2 Signal | Part P3 Pin No. | Part P4 Pin No. |
|---|---|---|---|---|---|---|
| BA | Not used | | | IO9 | 15 | 15 |
| BB | Not used | | | IO10 | 16 | 16 |
| BC | Not used | | | /SERVICE | 17 | 17 |
| BD | Not used | | | NC | 18 | 18 |
| BE | VSS | 13 | 13 | VSS | 19 | 19 |
| BF | Not used | | | VDD | 20 | 20 |
| BG | Not used | | | VSS | 21 | 21 |
| BH | Not used | | | VDD | 22 | 22 |
| BI | CLK2 | 14 | 14 | CLK2 | 23 | 23 |
| BJ | CLK1 | 15 | 15 | CLK1 | 24 | 24 |
| BK | VSS | 16 | 16 | VSS | 25 | 25 |
| BL | CP2 | 17 | 17 | Not used | | |
| BM | VDD | 18 | 18 | VDD | 26 | 26 |
| BN | CP0 | 19 | | CP0 | 28 | |
| BO | T1 | | 19 | T1 | | 28 |
| BP | CP1 | 20 | | CP1 | 29 | |
| BQ | T2 | | 20 | T2 | | 29 |
| BR | Not used | | | CP2 | 30 | 30 |

TABLE III

Third Edge 114C

| Pad No. | Mode M1 Signal | Part P1 Pin No. | Part P2 Pin No. | Mode M2 Signal | Part P3 Pin No. | Part P4 Pin No. |
|---|---|---|---|---|---|---|
| CA | CP3 | 21 | 21 | CP3 | 31 | 31 |
| CB | CP4 | 22 | 22 | CP4 | 32 | 32 |
| CC | Not used | | | D7 | 33 | 33 |
| CD | Not used | | | D6 | 34 | 34 |
| CE | Not used | | | D5 | 35 | 35 |
| CF | Not used | | | D4 | 36 | 36 |
| CG | Not used | | | D3 | 37 | 37 |
| CH | Not used | | | D2 | 38 | 38 |
| CI | VSS | 23 | 23 | VSS | 39 | 39 |
| CJ | CHIP_SEL | 23 | 23 | CHIP_SEL | 40 | 40 |
| CK | Not used | | | VDD | 40 | 40 |
| CL | Not used | | | VDD | 41 | 41 |
| CM | Not used | | | D1 | 42 | 42 |
| CN | IO10 | 24 | 24 | D0 | 43 | 43 |
| CO | VDD | 25 | 25 | VDD | 44 | 44 |
| CP | IO9 | 26 | 26 | R/W | 45 | 45 |
| CQ | IO8 | 27 | 27 | /E | 46 | 46 |
| CR | IO7 | 28 | 28 | A15 | 47 | 47 |
| CS | IO6 | 29 | 29 | A14 | 50 | 50 |

TABLE IV

Fourth Edge 114D

| Pad No. | Mode M1 Signal | Part P1 Pin No. | Part P2 Pin No. | Mode M2 Signal | Part P3 Pin No. | Part P4 Pin No. |
|---|---|---|---|---|---|---|
| DA | IO5 | 30 | 30 | A13 | 51 | 51 |
| DB | Not used | | | A12 | 52 | 52 |
| DC | VSS | 31 | 31 | Not used | | |
| DD | VDD | 32 | 32 | Not used | | |
| DE | Not used | | | A11 | 53 | 53 |
| DF | Not used | | | A10 | 54 | 54 |
| DG | Not used | | | A9 | 55 | 55 |
| DH | Not used | | | A8 | 56 | 56 |
| DI | Not used | | | A7 | 57 | 57 |
| DJ | Not used | | | A6 | 58 | 58 |
| DK | Not used | | | A5 | 59 | 59 |
| DL | Not used | | | A4 | 60 | 60 |
| DM | Not used | | | A3 | 61 | 61 |
| DN | Not used | | | A2 | 62 | 62 |
| DO | /RESET | 1 | 1 | Not used | | |
| DP | VDD | 2 | 2 | Not used | | |
| DQ | IO4 | 3 | 3 | A1 | 63 | 63 |
| DR | Not used | | | Not used | | |

The parts P1–P4 may include a variety of signals, including power signals and ground signals. A list of the signals and associated functionality is generally provided in Table V as follows:

TABLE V

Signals

| Signal Name | Direction | Signal Function |
|---|---|---|
| CLK1 | Input | Oscillator connection or external clock input |
| CLK2 | Output | Oscillator connection. Leave open when external clock in input to CLK1. |
| /RESET | I/O (Built-in pull-up) | Active LOW reset |
| /SERVICE | I/O (Built-in configurable pull-up) | Alternates between input and output at a 76 Hz rate |
| IO0–IO3 | I/O | General I/O ports with a large current-sink capacity. The output of the time/counter 1 may be routed to IO0. The output of timer/counter 2 may be routed to IO1. |
| IO4–IO7 | I/O (Built-in configurable pull-ups) | General I/O ports. The input to the timer/counter 1 may be derived from one of the IO4–IO7. The input to the timer/counter 2 may be derived from the IO4. |
| IO8–IO10 | I/O | General I/O port. May be used for serial communications under firmware control. |
| D0–D7 | I/O | Bidirectional memory data bus. |
| R/W | Output | Read/write control output for external memory. |
| /E | Output | Enable clock control output for the external memory. |
| A0–A15 | Output | Memory address output port. |
| VDD | Input | Power input (5, 3.3 or 1.8 Vdc nominal) |
| VSS | Input | Power input (0 Vdc ground) |
| VPP | INPUT | In-circuit rest mode control. If VPP is high when /RESET is asserted, the I/O, addresses and data buses become high-impedance. |
| CP0–CP4 | Communications Network Interface | Bidirectional port supporting communications in three modes. |
| T1–T2 | Bidirectional | Differential analog signals used to interface with a free topology network through a transformer. |
| NC | N/A | No connect. Must not be connected on the user's board. |

To handle the unique signals, power, grounds and such, the chip 106 generally has a greater number of the pads 112 than a number of pins 102 for a largest package 104 being implemented. In particular a first subset (e.g., S1) of the pads 112 may be used to implement the part P1. A second subset (e.g., S2) of the pads 112 may be used to implement the part P2. A third subset (e.g., S3) of the pads 112 may be used to implement the part P3. A fourth subset (e.g., S4) of the pads 112 may be used to implement the part P4. Other numbers of subsets may be defined to establish a different number of parts that may be created from the same chip 106. For example, two CHIP_SEL signals and three different packages 104 may define twelve subsets (four modes/package*three packages) for twelve different parts. In general, only one subset S1–S4 may be used at any time for fabricating the respective part P1–P4.

The subsets S1 and S2 may bond a same number of the pads 112 to the pins 102 to implement the parts P1 and P2. However, the first subset S1 may include one or more pads 112 that are not within of the second subset S2. Likewise, the second subset S2 may also include one or more pads 112 that are not within of the first subset S1. For example, the pins 19 and 20 may be bonded to the pads BN and BP for the part P1 and to the pads BO and BQ for the part P2 (dotted lines in FIG. 3). In other words, the pads BN and BP may be within the first subset S1 but not the second subset S2. Furthermore, the pads BO and BP may be within the second subset S2 but not the first subset S1. Similarly, the subsets S3 and S4 may bond a same number of the pads 112 to the pins 102 to implement the parts P3 and P4 where the third subset S3 is not identical to the fourth subset S4 (dotted lines in FIG. 4).

The subsets S1 and S3 may bond a different number of the pads 112 to the pins 102 to implement the parts P1 and P3 respectively. For example, the subset S3 may include address signals (e.g., A0–A15) not within the subset S1. In another example, the subset S1 may include pads 112 not within the subset S3. Particularly, the subset S3 may include a power pad AQ (e.g., VDD) not within in the subset S1. Likewise, the subsets S2 and S4 may bond a different number of the pads 112 to the pins 102 to implement the parts P2 and P4 respectively.

Some of the pads 112 may be used by multiple sets S1–S4 to convey the same signal. For example, the pad AD may be allocated to a signal (e.g., IO1) for the parts P1, P2, P3 and P4. Other pads 112 may be multiplexed to allocate different signals in the different modes M1–M2. For example, the pad AC may be multiplexed to transfer a signal (e.g., IO2) in the first mode M1 and another signal (e.g., IO0) in the second mode M2.

Certain signals may be shared between multiple pads 112 independent of the mode. For example, a reset signal (e.g., /RESET) may be transferred on the pads AG and DO simultaneously. While the chip 106 is mounted in the package 104A, (i) the signal /RESET may be coupled through the pad D0 to the pin 1 and (ii) the pad AG may not be wire bonded to any pin 102. While the chip 106 is mounted in the package 104B, (i) the signal /RESET may be coupled through the pad AG to the pin 6 and (ii) the pad D0 may not be wire bonded to any pin 102.

Generally, the particular pads 112 within each of the subsets S1–S4 may be, but are not necessarily unique for a particular part P1–P4. Relationships among the subsets S1–S4 may include intersections where one or more pads 112 are common to multiple subsets (e.g., non-empty intersections). Another relationship among the subsets S1–S4 may include set differences where one or more pads 112 are included in a subset but not another subset. Still another relationship among the subsets S1–S4 may include a minor subset being totally within a major subset where each pad 112 of the minor subset is also part of the major subset. Another relationship may be that two or more subsets are identical. Other subset relationships may be implemented to meet the design criteria of a particular application.

Referring to FIGS. 3–4, wire bonding diagrams of the parts P1–P4 respectively are shown. Connections between the pads 112 and the package traces 116 may be through wire bonds 118 or similar bonding methods. Each wire bond 118 may connect one or more pads 112 to a single package trace 116 of the package 104. An example of a double bond among two pads 112 and one package trace 116 may be seen in FIG. 3 where the pads CI and CJ are both wire bonded to the package trace for the pin 23 coupleable to a ground or power return signal (e.g., VSS). Another example of double bonding may be seen in FIG. 4 where pads CJ and CK are both wire bonded to the package trace for the pin 40 coupleable to a power signal (e.g., VDD). Some package traces 116 may not be wire bonded to any pad 112. Some pads 112 may not be wire bonded to any package trace 116.

Figure 5:
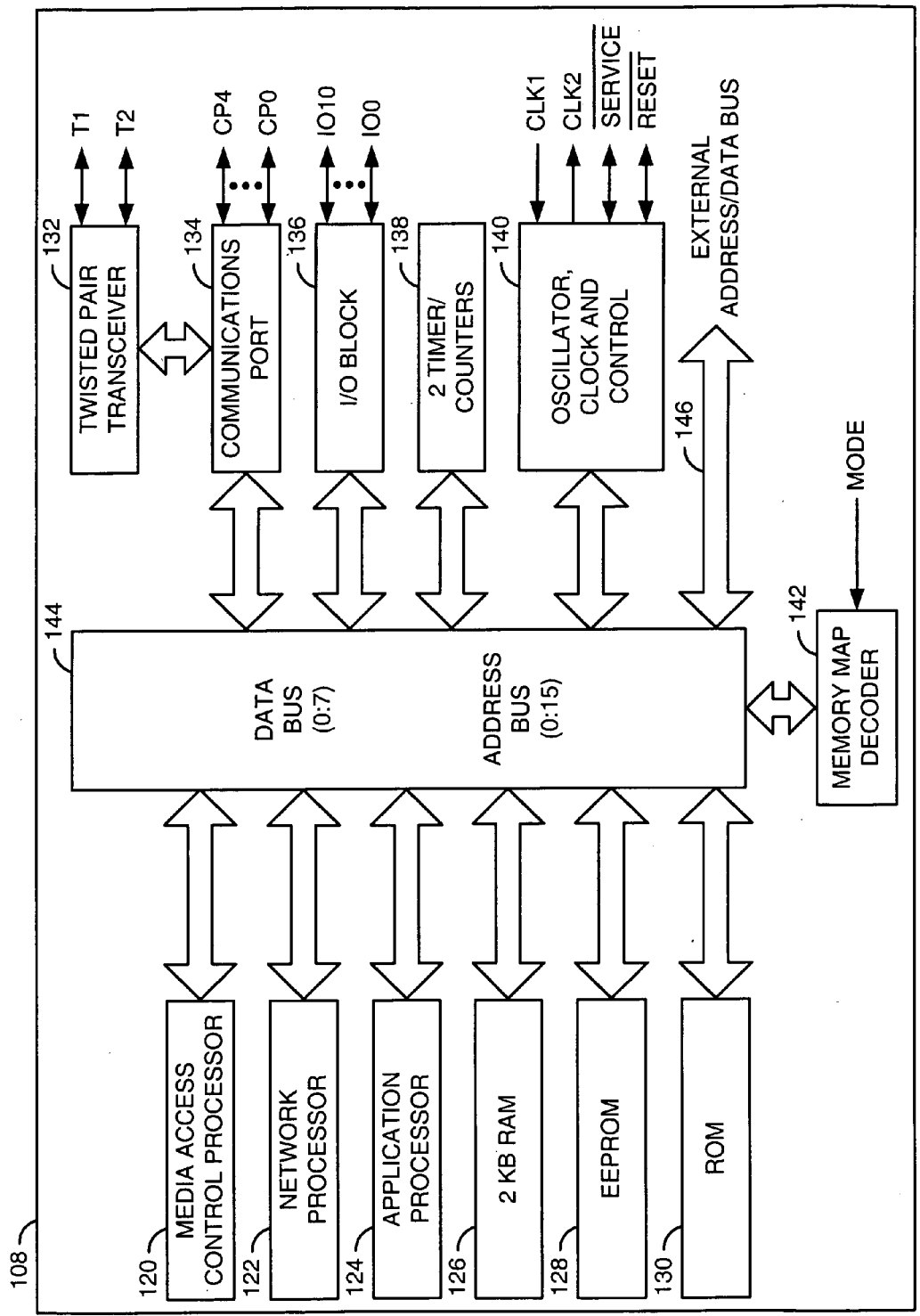
FIG. 5 is a block diagram of a logic circuit of the chip.

Referring to FIG. 5, a block diagram of the logic circuit 108 is shown. The logic circuit 108 generally comprises multiple processors 120, 122 and 124, multiple memory blocks 126, 128 and 130, a twisted pair transceiver 132, a communications port 134, a general purpose input/output (I/O) block 136, a multiple timer/counter circuit 138, an oscillator and clock and control circuit 140, a memory map decoder (MMD) block 142 and a data/address bus 144. An interface 146 may be provided by the parts P3 and P4 to couple to an external memory circuit (not shown). Generally, the logic circuit 108 may function as a node for a distributed intelligent control network. However, other appropriate logic functions may be executed by the chip 106 to meet the design criteria of a particular application.

The MMD 142 may have an interface to receive a signal (e.g., MODE). The signal MODE may inform the logic circuit 108 of the package 104A (e.g., 32-pin) or 104B (e.g., 64-pin) being used. While the signal MODE is in the first mode M1 (e.g., a logical LOW state), the logic circuit 108 may function as the parts P1 or P2 in the package 104A. While the signal MODE is in the second mode M2 (e.g., a logical HIGH state), the logic circuit 108 may function as the parts P3 or P4 in the package 104B. Distinguishing between the parts P1 and P2, and between the parts P3 and P4, may be accomplished by selectively wire bonding one or more predetermined signals (e.g., CP0 and CP1 or T1 and T2) to predetermined pins 102. In other implementations, the signal MODE may have greater than two modes that may distinguish multiple parts and/or packages to meet the design criteria of a particular device family.

While the signal MODE is in the first mode M1, the MMD 142 may establish a first memory mapping for the data/address bus 144 to map the addresses among the internal memory blocks 126, 128 and 130. While the signal MODE is in the second mode M2, the MMD 142 may establish another memory mapping for the data/address bus 144 to map the addresses among the internal memory blocks 126, 128 and 130 and the external memory circuit (not shown) that may be coupled to the interface 146.

Figure 6:
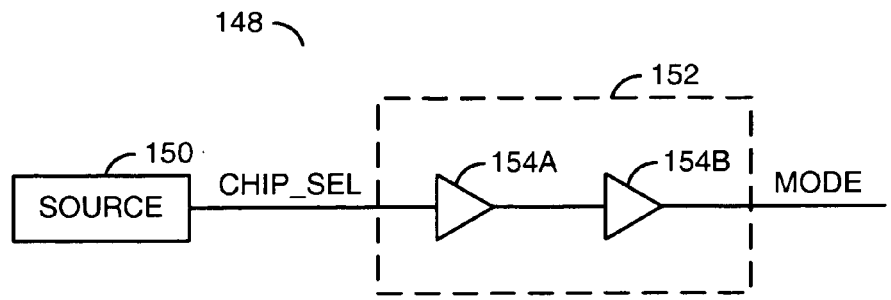
FIG. 6 is a block diagram of a mode signal source in the chip.

Referring to FIG. 6, a block diagram of circuit 148 that may generate the signal MODE is shown. The circuit 148 generally comprises a source circuit 150 and a buffer circuit 152. The source circuit 150 may generate and present a signal (e.g., CHIP_SEL) to the buffer circuit 152. The buffer circuit 152 generally comprises one or more buffers 154A–B. The buffers 154A–B may buffer the signal CHIP_SEL to generate and present the signal MODE. The signal MODE may be distributed to the logic circuit 108 and/or throughout the pad ring circuit 110.

In one embodiment, the source circuit 150 may be a pad 112. In particular, the source circuit 150 may be the pad CJ. The pad CJ may be wire bonded to either a power signal VDD or a ground signal VSS to generate the signal CHIP_SEL. If the pad CJ is wire bonded to a ground signal VSS, the signal MODE may be in the first mode M1 (e.g., the logical LOW state). If the pad CJ is wire bonded to a power signal VDD, the signal MODE may be in the second mode M2 (e.g., the logical HIGH state). Preferably, the pad CJ may be positioned between a pad 112 coupleable to a power signal VDD and another pad 112 coupleable to a ground signal VSS to make the double wire bonding to a nearby package trace 116 simple. For example, the pad CJ may be adjacent to the ground pad CI that may be wire bonded to a ground signal VSS in the parts P1–P4. The pad CJ may also be positioned adjacent to the power pad CK that may be wire bonded to a power signal VDD in the parts P3 and P4. (The pad CK may be unused in the parts P1 and P2). Multiple circuits 148 may be implemented to generate a multi-bit signal MODE that may represent greater than two possible modes or states. As stated previously, other connections between the pads 112 and the pins 102 may be provided to meet the design criteria of a particular application. For example, the pad CJ may be connected to the power signal VDD through tabs, solder bumps or the like in the parts P3 and P4 and to the signal VSS in the parts P1 and P2.

In another embodiment, the source circuit 150 may be implemented as a programmable fuse, a register or a memory bit within the chip 106. The source circuit 150 may be factory programmable and/or field programmable. For example, the source circuit 150 may be a register, writeable through one or more processors 120, 122 and 124 and/or pads 112. In another example, the source circuit 150 may be a predetermined memory cell of the EEPROM memory circuit 128 or the ROM memory circuit 130. In still another example, the source circuit 150 may be a register that is part of a boundary-scan chain of registers. In particular, the register may be implemented in accordance with the Joint Test Action Group (JTAG) architecture defined by the Institute of Electrical and Electronics Engineering (IEEE) Standard 1149.1–1990, titled "IEEE Standard Test Access Port and Boundary-Scan Architecture", published by the IEEE, New York, N.Y. Other designs for generating the signal CHIP_SEL may be implemented to meet the design criteria of a particular application.

The buffer circuit 152 may be implemented as a receive-only type of pad circuit. In another embodiment, the buffer circuit 152 may be implemented as a bidirectional type of pad circuit configured to receive at all times. Other designs for the buffer circuit 152 may be implemented to meet the design criteria of a particular application.

Figure 7:
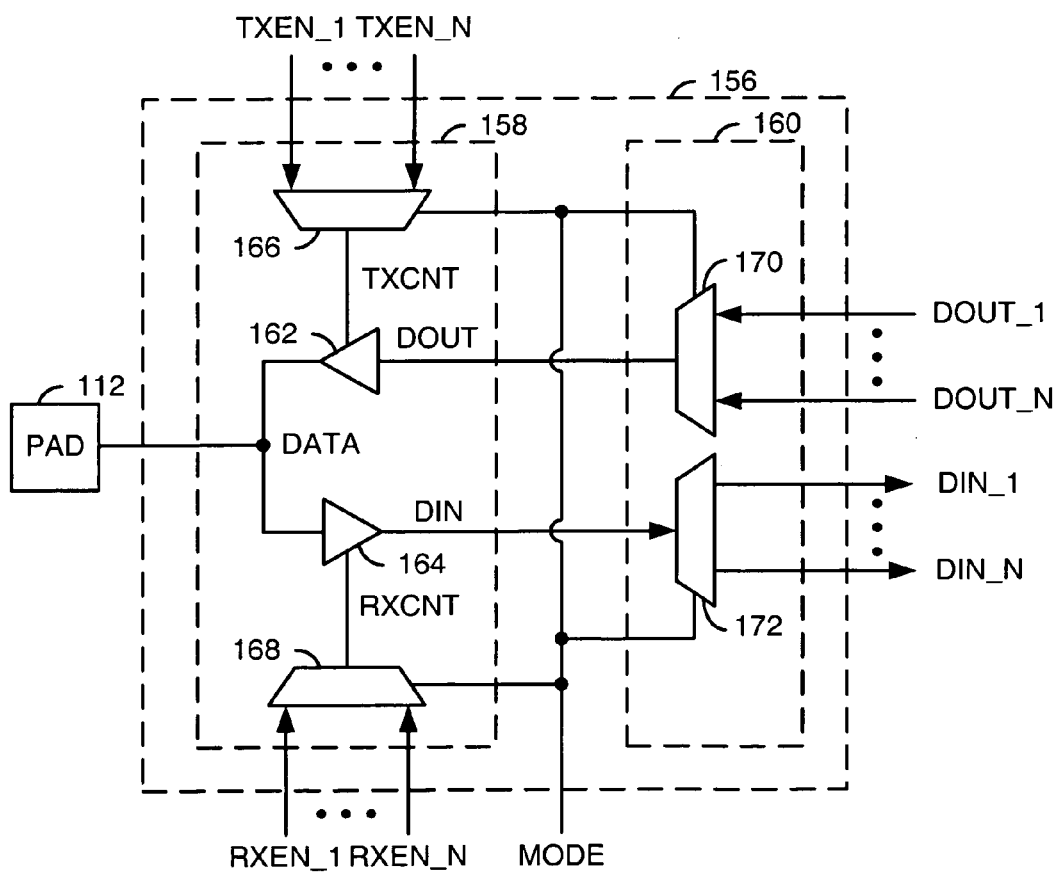
FIG. 7 is a block diagram of a pad circuit of the chip.

Referring to FIG. 7, a block diagram of a pad circuit 156 is shown. The pad circuit 156 may be implemented as a bidirectional circuit that may drive a signal (e.g., DATA) onto a pad 112 and receive the signal DATA from the same pad 112. The pad circuit 156 generally comprises a transceiver circuit 158 and an optional switching circuit 160.

The transceiver circuit 158 may be configured to amplify a signal (e.g., DOUT) to generate and present the signal DATA to the pad 112. The signal DOUT may be implemented as a data output signal. Generation of the signal DATA may be performed in response to a controlling enable signal chosen from several enable signals (e.g., TXEN_1–TXEN_N). Hereafter, the enable signals TXEN_1–TXEN_N may be referred to generally as the enable signals TXEN. The enable signals TXEN may be generated by the logic circuit 108. Some, all or none of the enable signals TXEN may be fixed to either the logical HIGH state or the logical LOW state instead of being controlled by the logic circuit 108.

Selection of a controlling enable signal TXEN_H (where 1<H<X) may be determined by the signal MODE. While the controlling enable signal TXEN_H is asserted, the signal DATA may be generated with the same logical value as the signal DOUT. While the controlling enable signal TXEN_H is de-asserted, the transceiver circuit 158 may present a high impedance to the pad 112.

The transceiver circuit 158 may be configured to generate and present a signal (e.g., DIN) in response to receiving the signal DATA from the pad 112. The signal DIN may be implemented as a data input signal. Generation of the signal DIN may be performed in response to a controlling enable signal chosen from several enable signals (e.g., RXEN_1–RXEN_N). Hereafter, the enable signals RXEN_1–RXEN_N may be referred to generally as the enable signals RXEN. The enable signals RXEN may be generated by the logic circuit 108. Some, all or none of the enable signals RXEN may be fixed to the logical HIGH state or to the logical LOW state instead of being controlled by the logic circuit 108.

Selection of a controlling enable signal RXEN_H (where 1<H<X) may be determined by the signal MODE. While the controlling enable signal RXEN_H is asserted, the signal DIN may be generated with the same logical state as the signal DATA. While the controlling enable signal RXEN_H is de-asserted, the transceiver circuit 158 may ignore the signal DATA.

The switching circuit 160 may be configured to multiplex multiple signals (e.g., DOUT_1–DOUT_N) to the signal DOUT and/or demultiplex the signal DIN to generate multiple signals (e.g., DIN_1–DIN_N). Each of the signals DOUT_1–DOUT_N may be implemented as a data output signal. Each of the signals DIN_1–DIN_N may be implemented as a data input signal. Selections of the multiplexing and the demultiplexing functions are generally determined by the signal MODE.

The switching circuit 158 may comprise a driver 162, a receiver 164, a multiplexer 166 and a multiplexer 168. The driver 162 may be implemented as a tri-state driver that is generally enabled/disabled by an enable or control signal (e.g., TXCNT). The multiplexer 166 may multiplex the enable signals TXEN in response to the signal MODE to generate and present the signal TXCNT. The enable signals TXEN may be generated and presented by the logic circuit 108. Some, all or none of the enable signals TXEN may be fixed to the logical HIGH state or the logical LOW state instead of being controlled by the logic circuit 108.

The receiver 164 may be implemented as a receiver that is generally enabled/disabled by an enable or control signal (e.g., RXCNT). The multiplexer 168 may multiplex the enable signals RXEN in response to the signal MODE to generate and present the signal RXCNT. The enable signals RXEN may be generated and presented by the logic circuit 108. Some, all or none of the enable signals RXEN may be fixed to the logical HIGH state or the logical LOW state instead of being controlled by the logic circuit 108.

The switching circuit 160 generally comprises a multiplexer 170 and a demultiplexer 172. The multiplexer 170 may be configured to multiplex the data output signals DOUT_1–DOUT_N to generate and present the signal DOUT to the transceiver circuit 158. The signal MODE may be used to control the multiplex selection of the multiplexer 170. The demultiplexer 172 may be configured to demultiplex the signal DIN to present and generate the signals DIN_1–DIN_N. The signal MODE may be used to control the demultiplex routing of the demultiplexer 172.

In one embodiment, the pad circuit 156 may be configured as a transmit-only type of pad circuit. Transmit-only operations generally require the driver 162, the multiplexer 166 and the multiplexer 170. If there is only a single data output signal (e.g., DOUT_1) in a particular design, the multiplexers 166 and 170 may be eliminated.

In another embodiment, the pad circuit 156 may be configured as a receive-only type of pad circuit. Receive-only operations generally require the receiver 164, the multiplexer 168 and the demultiplexer 172. If there is only a single data input signal (e.g., DIN_1) in a particular design, the multiplexer 168 and the de-multiplexer 172 may be eliminated.

Figure 8:
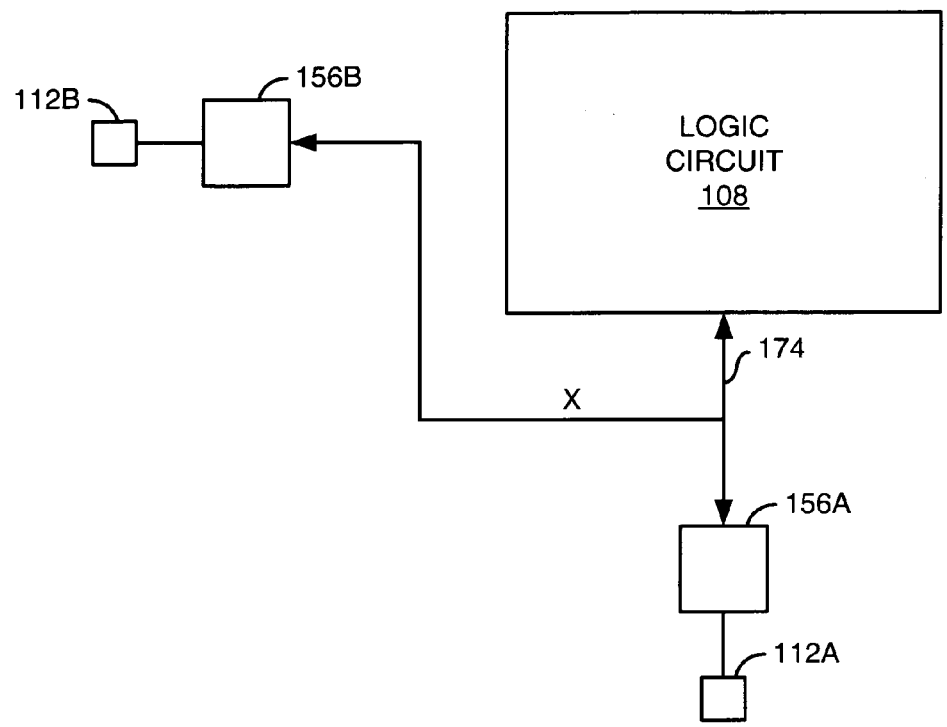
FIG. 8 is a block diagram of two pad circuits sharing a signal.

Referring to FIG. 8, a block diagram of a portion of the chip 106 is shown. A trace or signal line 174 may transfer a signal (e.g., X) between the logic circuit 108 and a first pad circuit 156A. The first pad circuit 156A may be connected to a first pad 112A to allow the signal X to be transmitted or received externally from/to the device 100. The signal line 174 may also carry the signal X to a second pad circuit 156B located at a distance from the first pad circuit 156A. The second pad circuit 156B may be connected to a second pad 112B to allow the signal X to be transmitted or received externally from/to the device 100.

In one embodiment, the first and the second pad circuit 156A–B may be configured such that the signal X may be passed between the logic circuit 108 and only one of the first or the second pads 112A–B at a time. In other words, while the first pad circuit 156A passes the signal X between the logic circuit 108 and the first pad 112A, the second pad signal 156B may block the signal X from the second pad 112B. For example, the signal X may be an I/O signal (e.g., IO3), the first pad 112A may be the pad AA and the second pad 112B may be the pad AF. While the signal MODE is in the first mode M1, the first pad circuit 156A may transfer the signal IO3 between the logic circuit 108 and the pad AA while the second pad circuit 156B blocks the signal IO3 from the pad AF. While the signal MODE is in the second mode M2, the first pad circuit 156A may block the signal IO3 from the pad AA while the second pad circuit 156B transfers the signal 103 between the logic circuit 108 and the pad AF.

In another embodiment, the first and the second pad circuits 156A–B may be configured to pass the signal X between the logic circuit 108 and both the first and the second pads 112A–B simultaneously. As an example, the signal X may be a service signal (e.g., /SERVICE), the first pad 112A may be the pad AI and the second pad 112B may be the pad BC. Regardless of the signal MODE, the signal /SERVICE may alternate between simultaneous transmission and simultaneous reception at both pads AI and BC. Therefore, the parts P1 and P2 may wire bond the pad AI to the pin 8 to transfer the signal /SERVICE while the pad BC is left unconnected. Likewise, the parts P3 and P4 may wire bond the pad BC to the pin 17 to transfer the signal /SERVICE while the pad AI is left unconnected.

Figure 9:
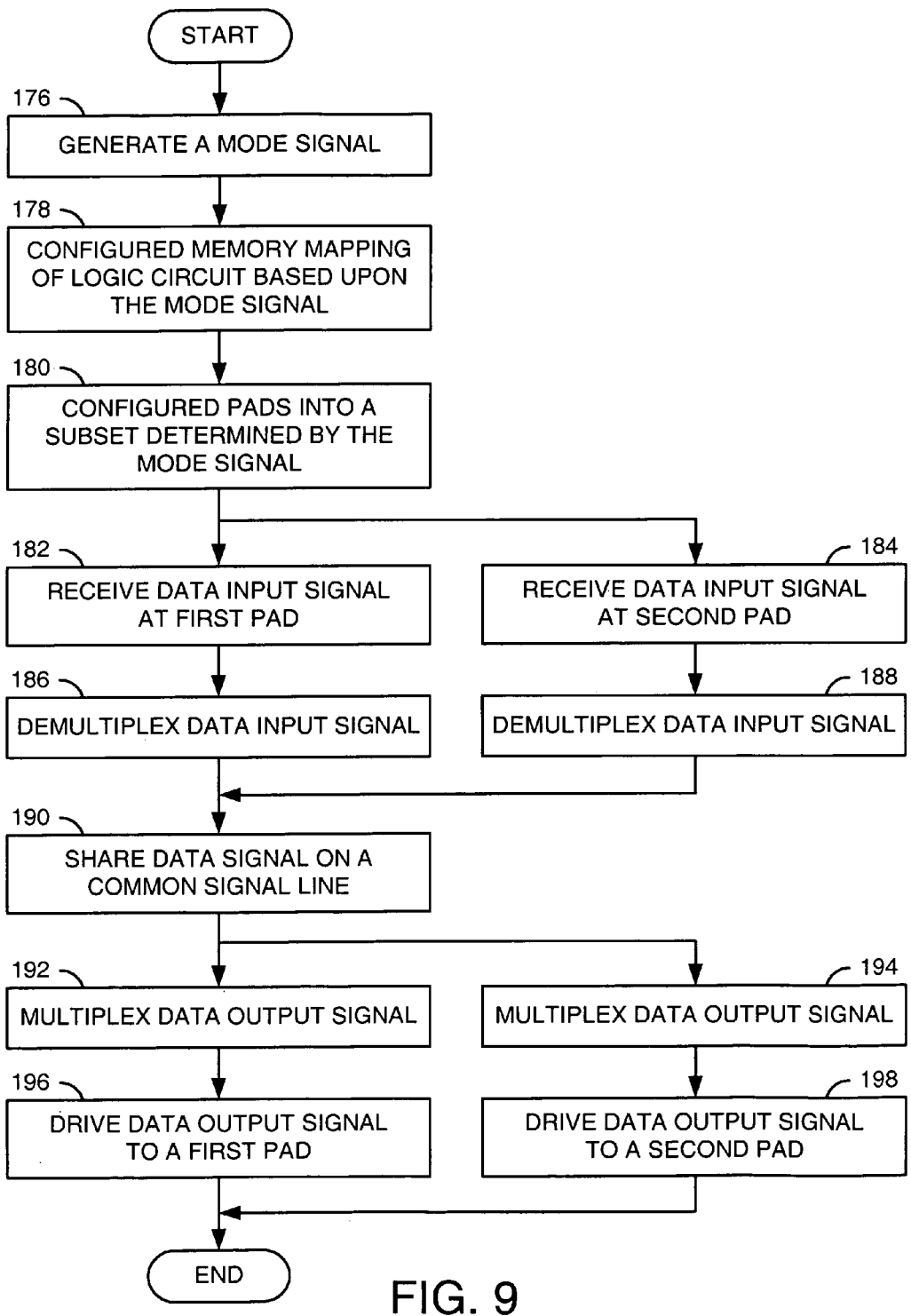
FIG. 9 is a flow diagram of a method of operation.

Referring to FIG. 9, a flow diagram of a method of operating the chip 106 is shown. The method generally begins with a generation of the signal MODE (e.g., block 176). The logic circuit 108 may respond to the signal MODE by configuring to the appropriate device 100A–B and/or part group P1/P2 or P3/P4 (e.g., block 178). The pads 112 and the pad circuit 156 may also respond to the signal MODE by configuring for to the indicated part group P1/P2 or P3/P4 (e.g., block 180).

While receiving a data input signal at a first pad 112A, the adjoining pad circuit 156A may buffer the data input signal (e.g., block 182). The same data input signal, or a different data input signal may simultaneously and independently be received by a second pad 112B and buffered by a second pad circuit 156B (e.g., block 184). The first pad circuit 156A may demultiplex the data input signal onto an appropriate signal line coupled to the logic circuit 108 (e.g., block 186). Likewise, the second pad circuit 156B may demultiplex the data input signal onto a signal line determined by the signal MODE (e.g., block 188). In some cases, the data input signal received by both pads 112A and 112B may be the same signal. Therefore, the first and the second pad circuits 156A and 156B may demultiplex the data input signal onto a shared or common signal line 174 coupled to the logic circuit 108 (e.g., block 190).

To transmit data, the first pad circuit 156A may multiplex one or more a data output signals presented by the logic circuit 108 as determined by the signal MODE (e.g., block 192). The second pad circuit 156B may simultaneously and independently multiplex one or more data output signals presented by the logic circuit 108 as determined by the signal MODE (e.g., block 194). The first and the second pad circuits 156A and 156B may multiplex different signals received on different signal lines and/or the same signal received on a common signal line (e.g., block 190). The first pad circuit 156A may then drive the selected data output signal onto the first pad 112A (e.g., block 196). The second pad circuit 156B may drive the selected data output signal onto the second pad 112B (e.g., block 198).

The sequence of receiving and transmitting signals on the various pads may be altered to meet the design criteria of a particular application. For example, some pads 112 may be receiving data signals while other pads 112 are simultaneously transmitting other data signals. Generally, each pad 112 and pad circuit 156 pair may operate independently of all other pads 112 and pad circuit 156 pairs. Exceptions to the independent operation may exist for signals such as the signal /RESET an the signal /SERVICE that may be designed to operate with two pad circuits 156 and two pads 112 in parallel.

The ability to create multiple parts from a single chip design may provide several advantages. For example, the single chip design may be fabricated from a predetermined set of masks. Once fabricated, the chip 106 may be tested and qualified using a common set of procedures. An overall effect may be to reduce the cost of the parts P1–P4 by using the single chip design instead of four unique designs.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. A chip comprising:
   a logic circuit configured to operate in a plurality of non-test modes in response to a mode signal;
   a plurality of pads configurable into a plurality of subsets such that one of said subsets is used by said logic circuit at a time in response to said mode signal; and
   a switching circuit configured to demultiplex an input signal received through a particular pad of said plurality of pads under control of said mode signal.

2. The chip according to claim 1, further comprising a first pad circuit configured to drive an output signal onto a first pad of said plurality of pads while enabled by one of a plurality of enable signals multiplexed under control of said mode signal.

3. The chip according to claim 1, wherein said switching circuit is further configured to multiplex a plurality of first signals to said particular pad under control of said mode signal.

4. The chip according to claim 1, further comprising:
   a first pad circuit directly connected to a first pad of said plurality of pads;
   a second pad circuit directly connected to a second pad of said plurality of pads; and
   a trace directly routing a signal among said first pad circuit, said second pad circuit and said logic circuit.

5. The chip according to claim 1, wherein a difference between two of said subsets includes a power pad of said plurality of pads, said power pad providing electrical power to operate said logic circuit.

6. The chip according to claim 5, further comprising a plurality of said power pads disposed along a side of said chip.

7. The chip according to claim 5, further comprising:
   a mode pad of said plurality of pads (i) adjacent to said power pad and (ii) configured to receive said mode signal from external to said circuit; and
   a ground pad of said plurality of pads adjacent to said mode pad, said ground pad providing a ground for said logic circuit.

8. The chip according to claim 5, wherein an intersection of said two subsets is a non-empty set.

9. The chip according to claim 1, further comprising a memory configured to store a value used to generate said mode signal.

10. The chip according to claim 1, wherein said logic circuit comprises a memory map decoder configured to operate with a plurality of memory mappings for a bus internal to said logic circuit based on said mode signal.

11. The chip according to claim 1, wherein a plurality of said pads from one of said subsets are configured to couple to an external memory in a subset of said modes.

12. The chip according to claim 11, wherein at least two of said subsets contain a different number of said pads.

13. The chip according to claim 1, further comprising a first pad circuit configured to receive a first signal from a first pad of said plurality of pads while enabled by one of a plurality of enable signals multiplexed under control of said mode signal.

14. The chip according to claim 1, wherein said logic circuit is further configured to function as a node for a distributed control network.

15. A chip comprising:
   means for generating a mode signal;
   means for configuring a logic circuit of said chip to operate in at least three modes in response to said mode signal;
   means for configuring a plurality of pads of said chip into a plurality of subsets such that one of said subsets is used by said logic circuit at a time in response to said mode signal; and
   means for demultiplexing an input signal received through a first pad of said plurality of pads under control of said mode signal.

16. The chip according to claim 15, further comprising a package having a plurality of traces connectable to a first subset of said pads to form a first part while said mode signal has a first value.

17. The chip according to claim 16, wherein said traces are connectable to a second subset of said pads to form a second part unique from said first part while said mode signal has a second value.

18. The chip according to claim 15, wherein (i) a first subset of said pads are connectable to a plurality of first traces of a first package to form a first part while said mode signal has a first value and (ii) a second subset of said pads are connectable to a plurality of second traces of a second package different than said first package to form a second part unique from said first part while said mode signal has a second value.

19. A chip comprising:
  a logic circuit configured to operate in a plurality of modes in response to a mode signal;
  a plurality of pads configurable into a plurality of subsets such that one of said subsets is used by said logic circuit at a time in response to said mode signal;
  a first pad circuit configured to drive a first pad of said plurality of pads in response to one of a plurality of enable signals determined by said mode signal; and
  a switching circuit configured to (i) multiplex a plurality of first signals to said first pad circuit in response to said mode signal and (ii) demultiplex a second signal from said first pad circuit in response to said mode signal.

* * * * *